United States Patent
Brittain et al.

(10) Patent No.: US 7,571,357 B2
(45) Date of Patent: Aug. 4, 2009

(54) MEMORY WRAP TEST MODE USING FUNCTIONAL READ/WRITE BUFFERS

(75) Inventors: Mark A. Brittain, Pflugerville, TX (US); Edgar R. Cordero, Round Rock, TX (US); John T. Hollaway, Jr., Austin, TX (US); Eric E. Retter, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 403 days.

(21) Appl. No.: 11/466,111

(22) Filed: Aug. 22, 2006

(65) Prior Publication Data

US 2008/0126911 A1    May 29, 2008

(51) Int. Cl.
*G06F 11/00* (2006.01)
(52) U.S. Cl. .......................... 714/42; 714/768; 714/30; 714/763
(58) Field of Classification Search ...................... None
See application file for complete search history.

(56) References Cited

U.S. PATENT DOCUMENTS

| | | | |
|---|---|---|---|
| 2001/0052090 A1* | 12/2001 | Mio | 714/42 |
| 2007/0133399 A1* | 6/2007 | Gangwal | 370/229 |
| 2007/0234182 A1* | 10/2007 | Wickeraad et al. | 714/763 |

* cited by examiner

*Primary Examiner*—Christopher S McCarthy
(74) *Attorney, Agent, or Firm*—Libby Z. Handelsman; Jack V. Musgrove

(57) ABSTRACT

A memory controller for a processing unit provides a memory wrap test mode path which selectively writes data from the write buffer of the controller to the read buffer of the controller, thereby allowing the write and read buffers to substitute for a system memory device during testing of the processing unit. The processing unit can thus be tested without the attached memory device yet still operate under conditions which generate bus traffic and chip noise similar to that generated under actual (end-use) operation. When a processor issues a write operation in test mode, the controller writes the data to an entry of the read buffer which corresponds to the write address. Thereafter, the processor can issue a read operation with the same address and the read buffer will send the data from the corresponding entry.

20 Claims, 5 Drawing Sheets

MEMORY WRAP TEST MODE USING FUNCTIONAL READ/WRITE BUFFERS

BACKGROUND OF THE INVENTION

1. Field of the Invention

The present invention generally relates to computer systems, and more particularly to a method of testing hardware components of a data processing system such as a processing unit.

2. Description of the Related Art

The basic structure of a conventional symmetric multi-processor computer system 10 is shown in FIG. 1. Computer system 10 has one or more processing units arranged in one or more processor groups; in the depicted system, there are four processing units 12a, 12b, 12c and 12d in processor group 14. The processing units communicate with other components of system 10 via a system bus 16. System bus 16 is connected to one or more service processors 18a, 18b, a memory controller 30, and various peripheral devices 22. A processor bridge 24 can optionally be used to interconnect additional processor groups. System 10 may also include firmware (not shown) which stores the system's basic input/output logic, and seeks out and loads an operating system from one of the peripherals whenever the computer system is first turned on (booted).

Memory controller 30 is further connected to a system memory device 20. System memory device 20 (random access memory or RAM) stores program instructions and operand data used by the processing units, in a volatile (temporary) state. Peripherals 22 may be connected to bus 16 via, e.g., a peripheral component interconnect (PCI) local bus using a PCI host bridge. A PCI bridge provides a low latency path through which processing units 12a, 12b, 12c and 12d may access PCI devices mapped anywhere within bus memory or I/O address spaces. The PCI host bridge interconnecting peripherals 22 also provides a high bandwidth path to allow the PCI devices to access RAM 20. Such PCI devices may include a network adapter, a small computer system interface (SCSI) adapter providing interconnection to a permanent storage device (i.e., a hard disk), and an expansion bus bridge such as an industry standard architecture (ISA) expansion bus for connection to input/output (I/O) devices including a keyboard, a graphics adapter connected to a display device, and a graphical pointing device (mouse) for use with the display device. The service processors can alternately reside in a modified PCI slot which includes a direct memory access (DMA) path.

In a symmetric multi-processor (SMP) computer, all of the processing units 12a, 12b, 12c and 12d are generally identical, that is, they all use a common set or subset of instructions and protocols to operate, and generally have the same architecture. As shown with processing unit 12a, each processing unit may include one or more processor cores 26a, 26b which carry out program instructions in order to operate the computer. An exemplary processing unit includes the POWER5™ processor marketed by International Business Machines Corp. which comprises a single integrated circuit (IC) superscalar microprocessor having various execution units, registers, buffers, memories, and other functional units, which are all formed by integrated circuitry. The processor cores may operate according to reduced instruction set computing (RISC) techniques, and may employ both pipelining and out-of-order execution of instructions to further improve the performance of the superscalar architecture.

Each processor core 26a, 26b includes an on-board (L1) cache (typically, separate instruction and data caches) implemented using high speed memory devices. Caches are commonly used to temporarily store values that might be repeatedly accessed by a processor, in order to speed up processing by avoiding the longer step of loading the values from system memory 20. A processing unit can include another cache such as a second level (L2) cache 28 which supports both of the L1 caches that are respectively part of cores 26a and 26b. Additional cache levels may be provided, such as an L3 cache 32 which is accessible via system bus 16. Each cache level, from highest (L1) to lowest (L3) can successively store more information, but at a longer access penalty. For example, the on-board L1 caches in the processor cores might have a storage capacity of 128 kilobytes of memory, L2 cache 28 might have a storage capacity of 4 megabytes, and L3 cache 32 might have a storage capacity of 32 megabytes. To facilitate repair/replacement of defective processing unit components, each processing unit 12a, 12b, 12c, 12d may be constructed in the form of a replaceable circuit board, pluggable module, or similar field replaceable unit (FRU), which can be easily swapped, installed in, or swapped out of system 10 in a modular fashion.

The control logic for various components of the memory hierarchy may include error correction code (ECC) circuits to handle errors that arise in a cache line. A bit in a given cache block may contain an incorrect value either due to a soft error (such as stray radiation or electrostatic discharge) or to a hard error (a defective cell). ECCs can be used to reconstruct the proper data stream. Some ECCs can only be used to detect and correct single-bit errors, i.e., if two or more bits in a particular block are invalid, then the ECC might not be able to determine what the proper data stream should actually be, but at least the failure can be detected. Other ECCs are more sophisticated and even allow detection or correction of multi-bit errors. These latter errors are costly to correct, but the design tradeoff is to halt the machine when double-bit (uncorrectable) errors occur.

When an IC chip is fabricated for a computer component such as a processing unit or cache memory, it can be evaluated using different testing techniques such as a wafer-level test or an automatic built-in self test (ABIST) to determine if there are any defective logic or storage cells. If a chip fails a wafer-level test, the part may be scrapped. If the chip passes the wafer-level test, the ABIST engine can be activated to perform a nonfunctional test. If a defective cell is found, various corrective measures can be taken. The chip may be repairable for example by setting a fuse which is indicative of the defective cell and redirects signals to another (redundant) cell. If the defect is not correctable, the part may again be scrapped. Testing is also useful in providing an analysis of the chip, to better understand how to improve the IC design and avoid device failures.

One problem with the foregoing tests is that they often do not detect marginal defects in a chip which may only cause problems during actual use of the computer system, because the wafer-level and ABIST procedures do not carry out functional testing of the system (as it would operate under general conditions). Those techniques are typically limited to non-functional testing of a single chip using test registers and scan procedures such as a level-sensitive scan design (LSSD). It accordingly becomes necessary to carry out costly bench testing with most of the system components installed, in order to accurately generate operational parameters such as bus traffic and chip noise associated with actual use of the system. In particular, complete functional testing of a processing unit requires interconnection with a memory device to generate "real" conditions. It would, therefore, be desirable to devise an improved method for evaluating a component of a data processing system such as a processing unit which enabled accurate functional testing of the unit without requiring interconnection of the unit with other system devices. It would be further advantageous if the method could utilize existing hardware features in the component so as to reduce or minimize any additional overhead.

SUMMARY OF THE INVENTION

It is one object of the present invention to provide an improved method of testing a component of a computer system.

It is another object of the present invention to provide such a method which does not require the component to be interconnected with another component that is located on a different integrated circuit chip.

It is yet another object of the present invention to provide an improved processing unit design that enables substantially complete functional testing without any attached system memory device.

The foregoing objects are achieved in a method of testing a processing unit having at least one processor and an associated memory controller adapted to interface with an external memory device, by issuing a write operation from the processor to the memory controller, loading data in a write buffer of the memory controller in response to the write operation, and selectively writing the data from the write buffer to a read buffer of the memory controller. The writing of the data to the read buffer is responsive to an active control signal which places the memory controller in a test mode. The data from the write buffer may be decoded using an error correction code (ECC) which checks for errors, and ECC bits are encoded back into the data that is written to the read buffer. The memory controller may use a memory wrap test mode path to write the data from the write buffer to the read buffer, with a multiplexer used to select either the data from the write buffer or data from the external memory device. After carrying out the test write operation, the processor can issue a test read operation to the memory controller which then sends the same data from the read buffer to the processor. The data can be stored in an entry of the read buffer which corresponds to an address provided with the write operation.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
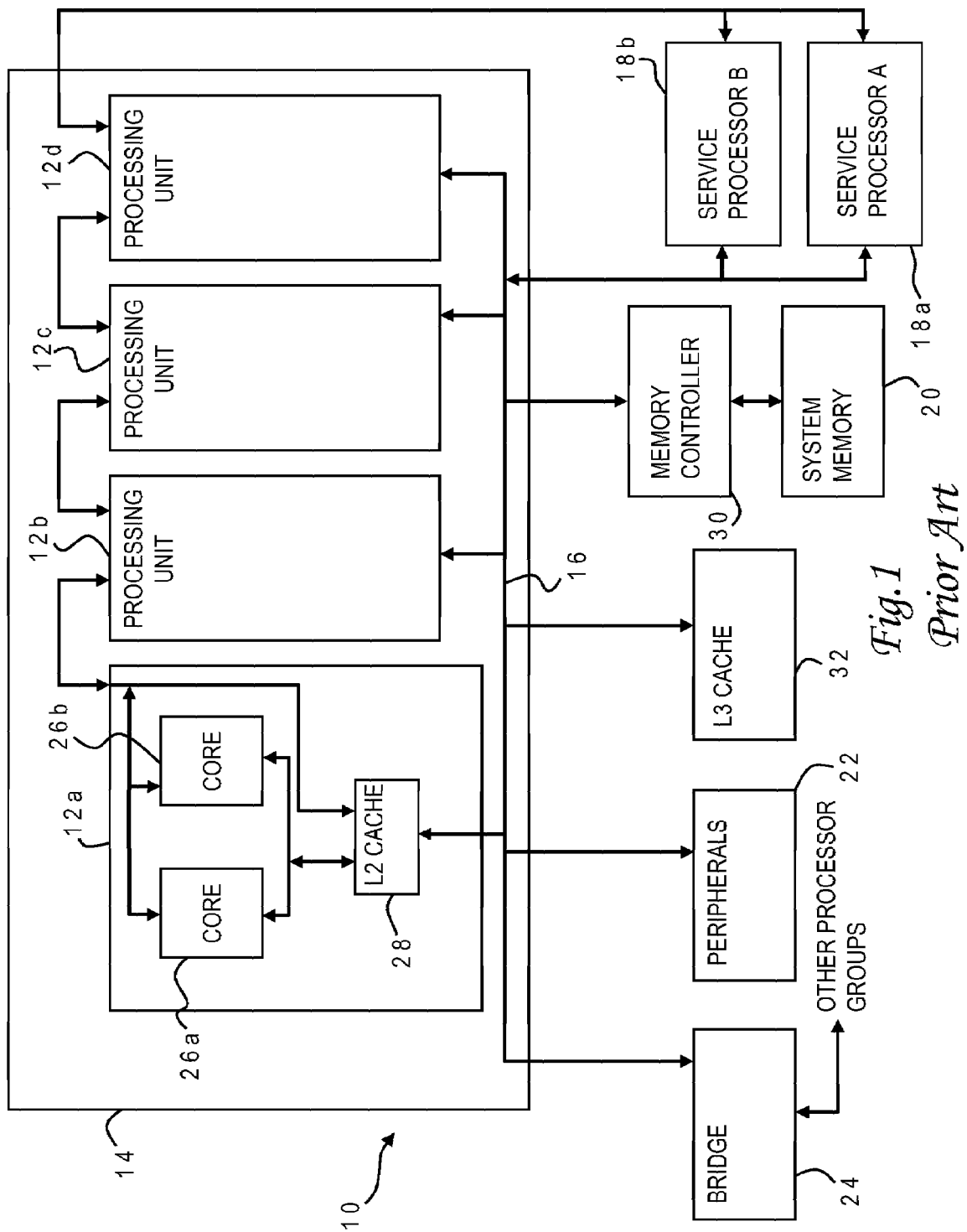
FIG. 1 is a block diagram of a conventional symmetric multi-processor (SMP) computer system, with internal details shown for one of the four generally identical processing units.
Figure 2:
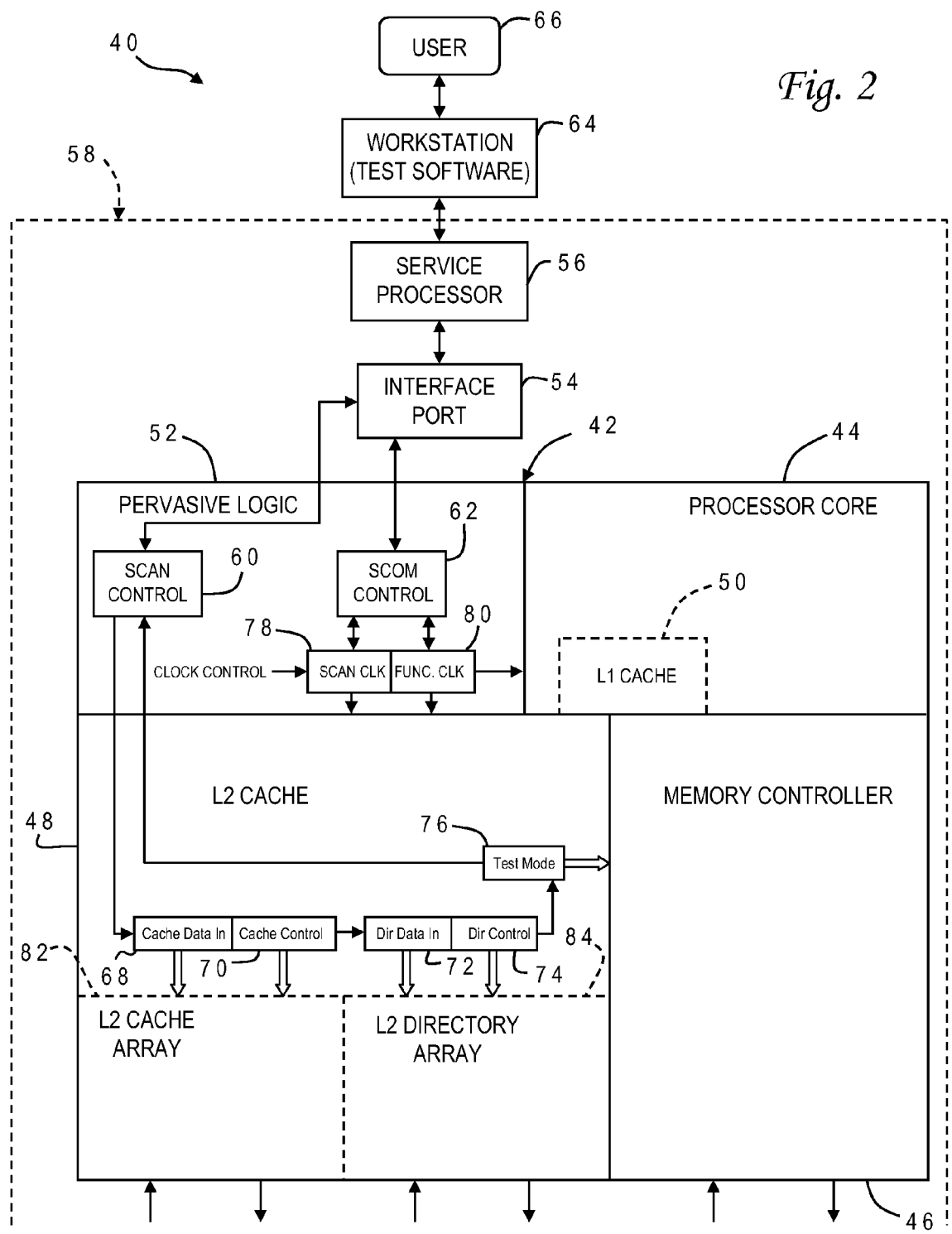
FIG. 2 is a block diagram of one embodiment of a test layout constructed in accordance with the present invention, depicting scan latches used for initializing a test procedure in a processing unit.

With reference now to the figures, and in particular with reference to FIG. 2, there is depicted one embodiment 40 of a test system constructed in accordance with the present invention. Test system 40 includes a processing unit 42 having one or more processor cores 44, a memory controller 46, and a second level (L2) cache 48. Each processor core has its own L1 (on-board) cache 50. Test system 40 may include additional features not shown in FIG. 2 but, in the illustrative implementation, it does not include any system memory device(s) and in particular there is no external memory device connected to memory controller 46.

Test system 40 also includes pervasive logic 52 which is used to load values into internal latches and to access internal registers of various components in system 40. Pervasive logic 52 may be connected to an interface (JTAG) port 54 which in turn is connected to a service processor 56. Interface port 54 complies with the Institute of Electrical and Electronics Engineers (IEEE) standard 1149.1 pertaining to a test access port and boundary-scan architecture. Processing unit 42, interface port 54 and service processor 56 may be mounted on the same circuit board or substrate 58.

Interface port 54 is connected to a scan ring controller 60 and a scan communications (SCOM) controller 62 in pervasive logic 52. SCOM controller 62 allows the service processor to access satellites located in the clock-controlled (functional) components of processing unit 42 during its normal operation. These SCOM satellites have internal control and error registers which can be used to enable various functions in the components. SCOM is an extension to the JTAG protocol allowed by IEEE standard 1149.1, that provides read and write access of the internal registers while leaving system clocks running. SCOM controller 62 may include appropriate logic to arbitrate between JTAG interface 54 and any assembly code commands from the processor core(s). SCOM controller 62 may alternatively be connected to an external SCOM interface which provides chip-to-chip communications without requiring involvement of the service processor. Scan ring controller 60 provides a JTAG scan function in a level sensitive scan design (LSSD) to set the internal latch state of the system with functional clocks stopped.

Service processor 56 receives commands via an Ethernet (CAT5) connection from test software loaded on an external test unit or workstation 64 which is managed by a user 66. The user controls the test software to load a functional test program into a particular component or components of system 40, and in particular to test processor 44. For example, the test software may instruct pervasive logic 52 to load a functional stress routine using test patterns. A functional test is a procedure that is carried out by system 40 while operating in its normal processing mode with system clocks controlling the operation, as opposed to procedures that are performed with free-running clocks outside of the control of the system clocks. Using functional test patterns, it is possible to detect potential defects in the processing unit components that might not be discovered by nonfunctional test procedures. The functional tests may be initiated by the test software after performing nonfunctional testing such as ABIST testing.

The test program may be loaded using scan ring controller 60 to initialize the internal latches in the scan ring. There may be tens of thousands of latches in a scan ring. In this embodiment, the scan ring includes an L2 cache data input latch 68, an L2 cache control input latch 70, a directory data input latch 72, a directory control input latch 74 and a memory controller test mode latch 76. The four cache latches are used to load appropriate program instructions and operand data into the L2 cache in order to bootstrap (initialize) the system. A single scan input port is utilized (64 bytes), rather than providing latches for every entry in the cache. In a test procedure for processing unit 42, all functional clocks of processing unit 42 are stopped by SCOM controller 62 while the values for partial cache lines are scanned in to latches 68, 70, 72 and 74 by pulsing scan clock 78 under the control of scan ring controller 60. Once the scan in is complete, SCOM controller 62 pulses functional clock 80 to move the values from the scan ring latches into the functional components such as L2 cache array 82 and L2 directory array 84. Testing begins after these steps have been repeated such that all of the cache lines have been so loaded into L2 cache array 38 and L2 directory array 40. For example, the test software may instruct pervasive logic 52 to load an operating system kernel into L2 cache 48, such as a Linux operating system. While this implementation illustrates booting system 40 from an external source, those skilled in the art will appreciate that the bootstrap information could alternatively be loaded from a source internal to system 40 which is connected to service processor 56 or directly to JTAG port 54, such as firmware having a basic input/output system (BIOS).

Figure 3:
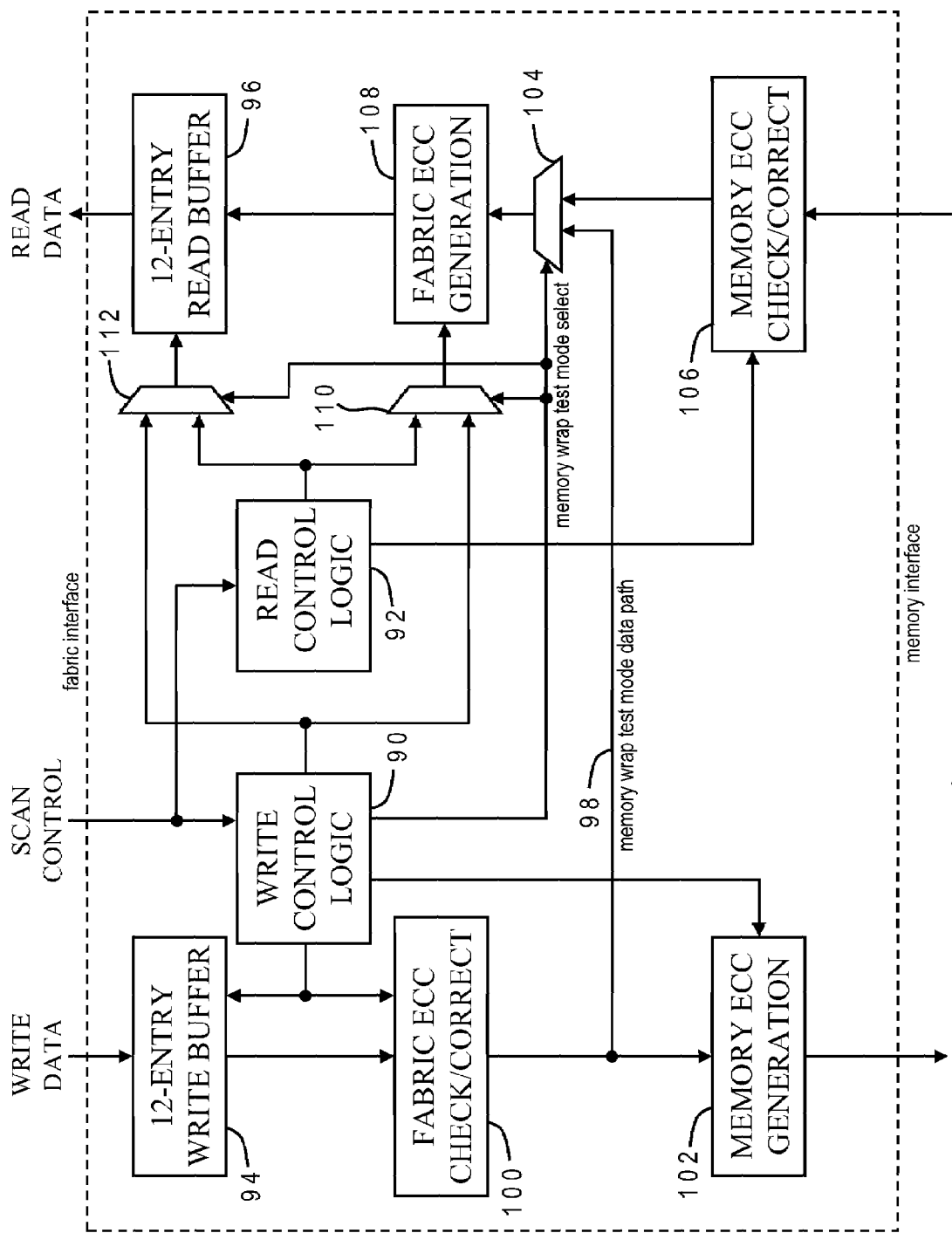
FIG. 3 is a block diagram of the control logic and data paths for a memory controller used in the processing unit of FIG. 2.

Testing of processing unit 42 includes evaluation of its performance under conditions which closely simulate use of the device by an end user, including processing of instructions which access (read/write) system memory; however, the present invention accomplishes this testing without the need for actually providing a system (external) memory device by utilizing read/write buffers in memory controller 46. As seen in FIG. 3, memory controller 46 includes write control logic 90 and read control logic 92 which are responsive to the scan control signal from control register 76. During the test mode, write control logic 90 and read control logic 92 direct the components of memory controller 46 to receive and carry out simulated read/write operations of system memory. Memory controller 46 includes a 12-entry write buffer 94 and a 12-entry read buffer 96 which may be connected to a fabric bus or other system interconnection that allows communication with processor 44 and cache 48. The read and write buffers are used functionally (during normal operation of processing unit 42) to temporarily store read and write values from memory across an asynchronous clock boundary. In the test mode, a data path 98 is provided between the write logic and the read logic which wraps the data from write buffer 94 into the read buffer 96, without ever activating the interface between memory controller 46 and any system memory device. Thereafter, when a read operation is received, the same data from the previous write operation is sourced from read buffer 96, and the interface between memory controller 46 and system memory again is not activated.

In the exemplary embodiment of memory controller 46, there is a one-to-one relationship between the write queue holding a write operation and a write buffer entry, e.g., when write queue #1 is active, the data associated with write queue #1 is located in write buffer entry #1. In normal (non-test) operation, the write queues and buffers are assigned in a way that is independent of the address of the write operation. In memory wrap test mode, the read and write buffers are configured as a 12-entry memory, and the write queues and buffers are assigned as a function of the address of the write operation. This implementation uses address bits (50:53) to assign write queues and buffers. For example, if write address (50:53)=0011 then write queue and buffer #3 are assigned to the write operation.

In normal memory write mode, the fabric write interface writes memory data to the 12-entry write buffer, and signals write control logic 90 that the write data is ready. The memory write data is then read from the 12-entry write buffer and sent through a fabric error correction code (ECC) check/correct circuit 100 and memory ECC generation circuit 102. Fabric ECC check/correct circuit 100 uses ECC bits embedded in the write data stored in write buffer 94 to decode the data and correct certain errors (e.g. single-bit errors) in the data. Memory ECC generation circuit 102 recalculates ECC bits and appends those bits to encode the data that is sent via the memory interface to a system memory device.

In memory wrap test mode, the fabric write interface similarly writes memory data to the 12-entry write buffer and signals write control logic 90 that the write data is ready. However, when the control signal from scan register 76 is active, the write data is immediately read from the entry in write buffer 94 selected by write address bits (50:53) and written to an entry in read buffer 96, also selected by write address (50:53). The memory write data is sent through fabric ECC check/correct circuit 100 along memory wrap test mode data path 98 to a memory wrap test mode data multiplexer 104 whose select line is controlled by write control logic 90. The other input to memory wrap test mode data multiplexer 104 is from a memory ECC check/correct circuit 106 used in normal read operations to check and correct errors in data from system memory. The output of memory wrap test mode data multiplexer 104 is a fabric ECC generation circuit 108 which recalculates ECC bits and appends those bits to the data that is then stored in read buffer 96 and sent via the fabric interface to processor core 44. Fabric ECC generation circuit 108 is selectively responsive to signals from read control logic 92 (in normal operation) or write control logic 90 (in test mode) via memory wrap test mode ECC multiplexer 110 whose select line is controlled by write control logic 90. Similarly, the specific storage location (entry) in read buffer 96 is selectively responsive to signals from read control logic 92 (in normal operation) or write control logic 90 (in test mode) via memory wrap test mode read buffer multiplexer 112 whose select line is again controlled by write control logic 90. For write operations in test mode, memory ECC generation circuit 102 and memory ECC check/correct circuit are never activated. Hence it is not necessary to have a system memory device connected or to provide any other system memory interface to memory controller 46.

In the exemplary embodiment of memory controller 46, there is not a one-to-one relationship between the read queue holding a read operation and the entry in read buffer 96 used to capture the memory read data in normal operation. Rather, the read buffer entries are assigned dynamically, as previous memory read operations complete and the contents of their read buffers are sent out by the fabric interface. In normal memory read mode, the fabric read interface provides a memory address and signals read control logic 92 that a read operation is to be performed. The memory read data is read from the memory interface, sent through memory ECC check/correct circuit 106 and fabric ECC generation circuit 108, and written to read buffer 96. Read control logic 92 then signals the fabric read interface that the read data is ready, and the fabric interface reads the data from read buffer 96 and passes it to processor core 44.

In memory wrap test mode, the fabric read interface again provides a memory address and signals that a read operation is to be performed; however, when the control signal from scan register 76 is active, the contents of the read buffer are directly selected by address bits (50:53) and correspond to data previously written into read buffer 96 by a write operation during test mode. Accordingly, read control logic 92 can immediately signal the fabric read interface that the read data is ready without ever activating memory ECC check/correct circuit 106 or fabric ECC generation circuit 108.

Figure 4A:
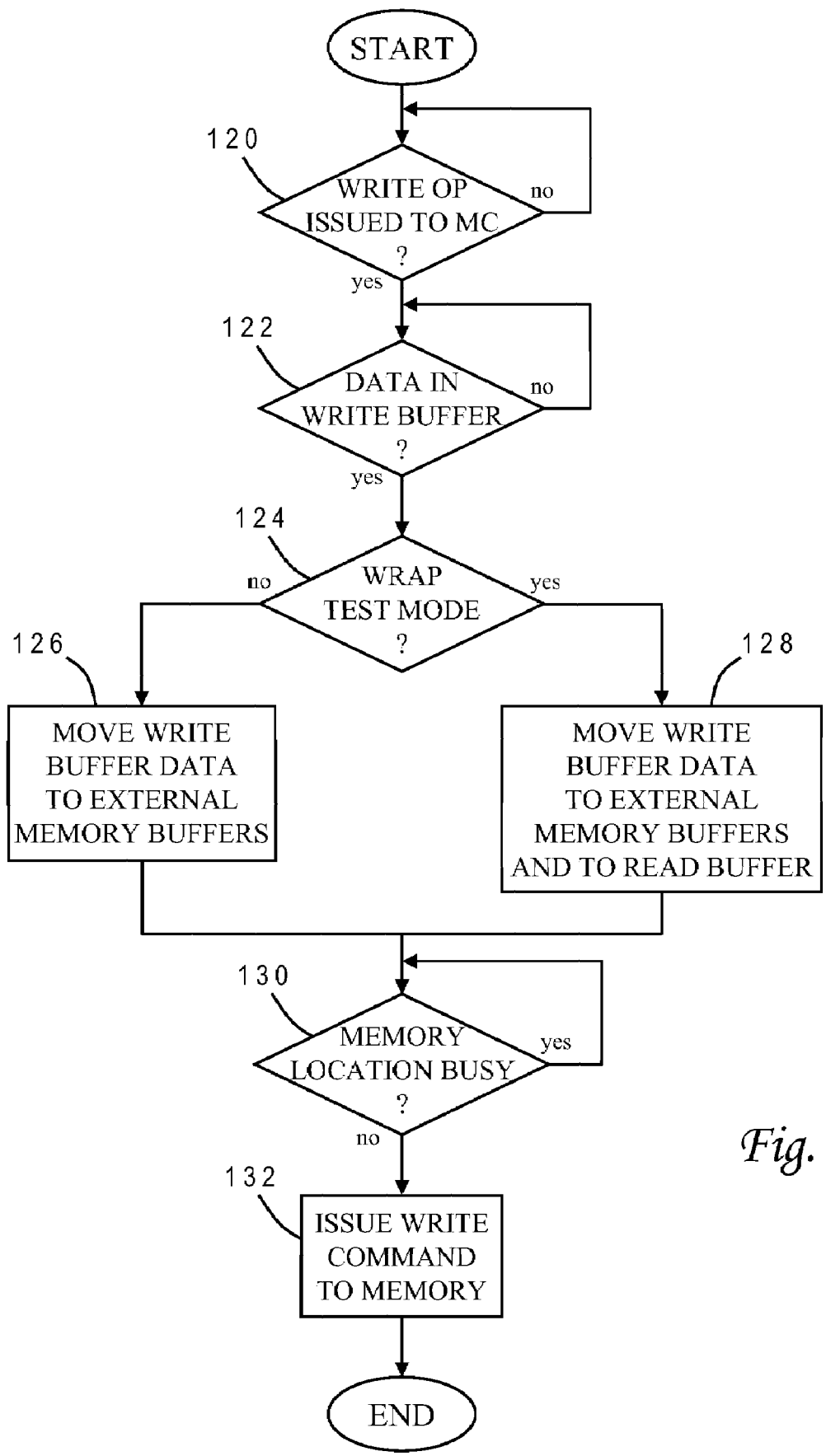
FIG. 4A is a chart illustrating the logical flow for a write operation of the memory controller of FIG. 3 in accordance with one implementation of the present invention.
Figure 4B:
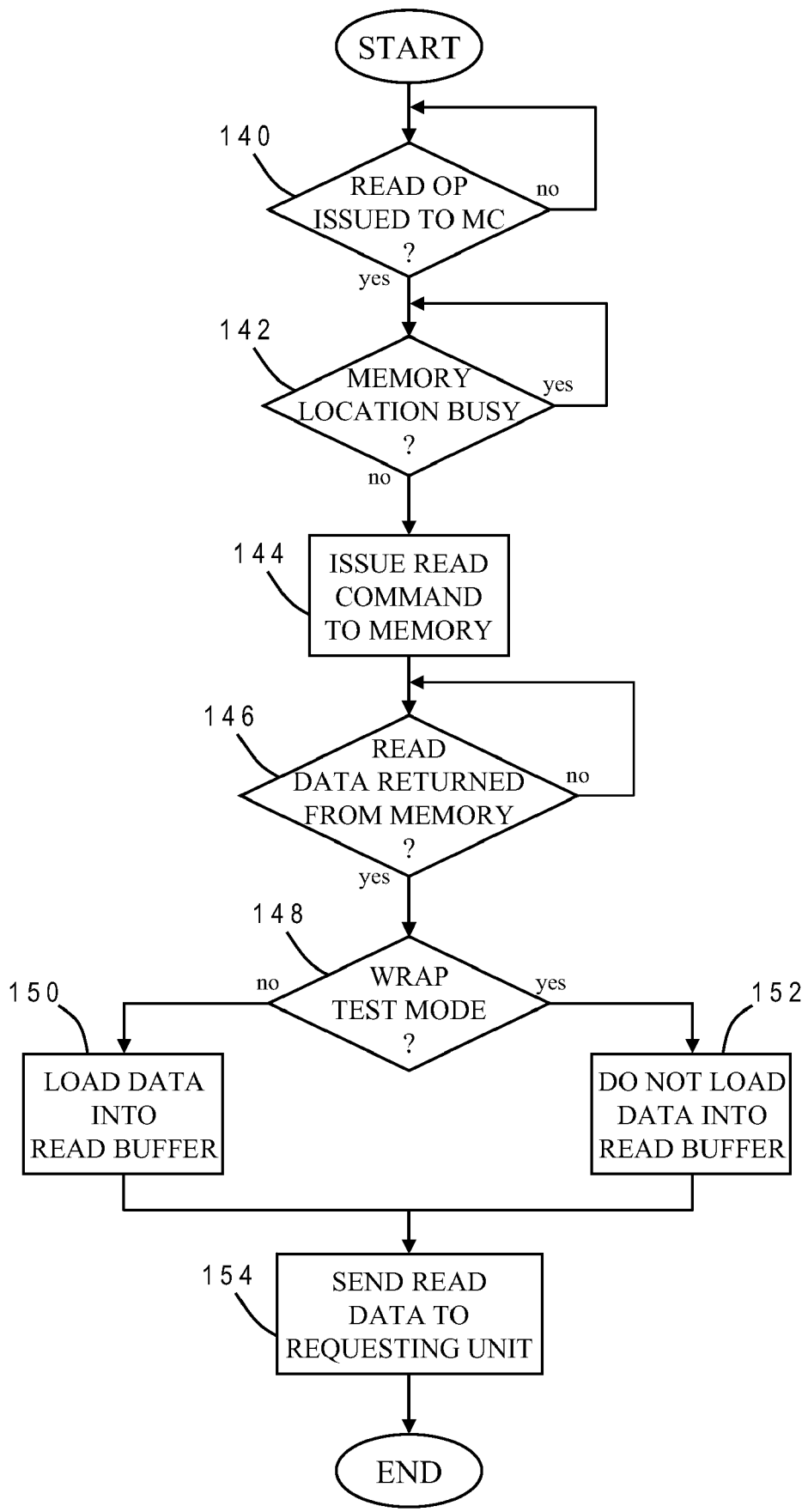
FIG. 4B is a chart illustrating the logical flow for a read operation of the memory controller of FIG. 3 in accordance with one implementation of the present invention The use of the same reference symbols in different drawings indicates similar or identical items.

The invention may be further understood with reference to the flow charts of FIGS. 4A and 4B which illustrate the write and read operations according to one implementation for memory controller 46. The process for handling write operations as shown in FIG. 4A begins with a check for any pending write operation issued to the memory controller by the processor (120), which repeats in a loop until a write operation is present. If the write buffer is currently full, the procedure waits until an entry is available (122) and loads the data into the write buffers. The memory controller then moves the write buffer data based on whether the unit is currently in a memory wrap test mode (124). If the unit is not in test mode, i.e., it is in normal operation, then the data is moved only to the external memory buffers (126). If the unit is in test mode, then the data can still be moved to the external memory buffers but it is also written to the read buffer. Thereafter, the memory controller waits until the memory location is available (130). During test mode, the write control logic will immediately provide a signal which indicates that the memory location is ready, even if there is no connected memory device. The memory controller then issues a write command to the system memory device (132). This last step can still be performed even if no system memory device is connected to the memory controller during test mode, which is superfluous but avoids the need for further modification to the memory controller logic.

The process for handling read operations as shown in FIG. 4B begins with a check for any pending read operation issued to the memory controller (140), which repeats in a loop until a read operation is present. If the memory location is busy, the process waits until it becomes available (142) but the write control logic will provide an immediate ready indication during test mode. A read command is issued to system memory, again even if there is no interconnected system memory (144). The procedure waits for memory to return the data (146) which is immediately signaled by the write control logic during test mode. If the memory controller is not in memory wrap test mode (148), it loads the read data into the read buffer (150), but if it is in test mode, data does not need to be loaded since it was previously stored there as part of the write operation (152). The read data is then sent to the requesting unit (154), i.e., processor core 44.

The present invention thus simplifies testing of processing unit 42 by allowing the test software to carry out the test procedure without having a system memory device attached, yet bus traffic and chip noise are generated that more closely resemble that generated by chip operation during normal use of the processing unit in a completed system. With this on-chip functional testing, costly system bench testing can be reduced or eliminated while maintaining a high level of quality assurance. The invention further advantageously provides this functionality while adding very little overhead (primarily the memory wrap test mode data path and multiplexers) since it is able to use the existing read/write buffers of the memory controller.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the memory controller may include other components besides those shown in FIG. 3, so the memory wrap test mode path may be interposed in other manners between the write and read buffers, or may directly interconnect the buffers without any ECC logic in the path. It is therefore contemplated that such modifications can be made without departing from the spirit or scope of the present invention as defined in the appended claims.

What is claimed is:

1. A method of testing a processing unit having at least one processor and an associated memory controller adapted to interface with an external memory device, comprising:
issuing a write operation from the processor to the memory controller;
loading data in a write buffer of the memory controller in response to the write operation; and
selectively writing the data from the write buffer to a read buffer of the memory controller along a memory wrap test mode path separate from the external memory device.

2. The method of claim 1 wherein said writing of the data to the read buffer is responsive to an active control signal which places the memory controller in a test mode.

3. The method of claim 1, further comprising:
decoding the data from the write buffer using an error correction code (ECC) which checks for errors; and
encoding ECC bits into the data that is written to the read buffer.

4. The method of claim 1 wherein:
the memory wrap test mode path provides a first input to a multiplexer having a second input adapted to receive data from the external memory device; and
write control logic of the memory controller selects the data from the memory wrap test mode path as an output of the multiplexer.

5. The method of claim 1, further comprising:
issuing a read operation from the processor to the memory controller; and
sending the data from the read buffer to the processor in response to the read operation.

6. The method of claim 5 wherein the data is stored in an entry of the read buffer which corresponds to an address provided with the write operation.

7. A processing unit comprising:
at least one processor which issues read and write operations; and
at least one memory controller associated with said processor, said memory controller having a write buffer, a read buffer, and a memory wrap test mode path which is selectively used to write data from said write buffer to said read buffer.

8. The processing unit of claim 7, further comprising:
a scan ring having a plurality of scan registers which latch values into functional components of the processing unit, said scan registers including at least one control register for said memory controller, wherein use of said memory wrap test mode path to write data from said write buffer to said read buffer is responsive to an active signal from said at least one control register.

9. The processing unit of claim 7 wherein said memory controller further includes:
an error correction code (ECC) checking circuit which decodes data from said write buffer; and
an ECC generation circuit which encodes ECC bits into data that is written to said read buffer.

10. The processing unit of claim 7 wherein said memory controller further includes:
a multiplexer having a first input connected to said memory wrap test mode path and a second input adapted to receive data from an external memory device; and
write control logic which selects data from said memory wrap test mode path as an output of said multiplexer.

11. The processing unit of claim 10 wherein:
said processor issues a write operation to said memory controller with an address; and
said memory controller writes data for the write operation to an entry of said read buffer which corresponds to the address.

12. The processing unit of claim 10 wherein:
said processor further issues a read operation to said memory controller with the same address of the previous write operation; and
said memory controller sends the data from said entry of said read buffer to said processor in response to the read operation.

13. A test system comprising:
a workstation having test software;
an interface; and
a processing unit connected to said workstation by said interface, said processing unit having at least one processor core and at least one memory controller associated with said processor core adapted to interface with an external memory device, wherein said memory controller includes a memory wrap test mode path which is selectively used to write data from a write buffer of said memory controller to a read buffer of said memory controller in response to an active control signal generated by the test software.

14. The test system of claim 13 wherein said processing unit further includes a scan ring having a plurality of scan registers which latch values into functional components of said processing unit, said scan registers including at least one control register for said memory controller which is set by the test software to generate the active control signal.

15. The test system of claim 13 wherein said memory controller further includes:
an error correction code (ECC) checking circuit which decodes data from said write buffer; and
an ECC generation circuit which encodes ECC bits into data that is written to said read buffer.

16. The test system of claim 13 wherein said memory controller further includes:
a multiplexer having a first input connected to said memory wrap test mode path and a second input adapted to receive data from the external memory device; and
write control logic which selects data from said memory wrap test mode path as an output of said multiplexer.

17. The test system of claim 13 wherein:
said processor core issues a write operation to said memory controller with an address; and
said memory controller writes data for the write operation to an entry of said read buffer which corresponds to the address.

18. The test system of claim 17 wherein:
said processor core further issues a read operation to said memory controller with the same address of the previous write operation; and
said memory controller sends the data from said entry of said read buffer to said processor in response to the read operation.

19. In a memory controller having a write buffer which receives data from a processor and a read buffer which sends data to the processor, the improvement comprising:
a memory wrap test mode path interposed between the read and write buffers; and
control logic which selectively loads values from the write buffer into the read buffer using said test mode path.

20. The improved memory controller of claim 19 wherein said control logic stores data from the write buffer in an entry of the read buffer which corresponds to an address provided with a write operation.

* * * * *